(12) United States Patent
Rashed et al.

(10) Patent No.: US 7,612,577 B2
(45) Date of Patent: Nov. 3, 2009

(54) SPEEDPATH REPAIR IN AN INTEGRATED CIRCUIT

(75) Inventors: Mahbub M. Rashed, Austin, TX (US); Milind P. Padhye, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 270 days.

(21) Appl. No.: 11/829,153

(22) Filed: Jul. 27, 2007

(65) Prior Publication Data

US 2009/0031163 A1    Jan. 29, 2009

(51) Int. Cl.
*H03K 19/003* (2006.01)
(52) U.S. Cl. .......................................... 326/10; 326/95
(58) Field of Classification Search .................. 326/93, 326/95, 98, 10
See application file for complete search history.

(56) References Cited

U.S. PATENT DOCUMENTS

| | | | |
|---|---|---|---|
| 6,377,101 B1 * | 4/2002 | Eto et al. .................... | 327/270 |
| 6,657,907 B2 | 12/2003 | Lee | |
| 6,937,536 B2 | 8/2005 | Shirley | |
| 7,180,324 B2 * | 2/2007 | Chan et al. .................... | 326/10 |
| 7,411,412 B2 * | 8/2008 | Arakawa et al. ............. | 326/10 |
| 2003/0229824 A1 | 12/2003 | Waller | |

* cited by examiner

*Primary Examiner*—James Cho
(74) *Attorney, Agent, or Firm*—James L. Clingan, Jr.; Michael Balconi-Lamica

(57) ABSTRACT

A circuit comprises a first plurality of transistors of a first channel length disposed along a speedpath, the first plurality of transistors providing a first timing performance. The circuit also comprises a second plurality of transistors of a second channel length having an expected equivalent functionality as the first plurality of transistors and disposed in parallel with the first plurality of transistors along the speedpath, wherein the second channel length is different from the first channel length. In addition, the circuit comprises an element configured to selectively replace the first plurality of transistors with the second plurality of transistors in response to a determination that the first timing performance of the first plurality of transistors fails a timing requirement of the speedpath. In one embodiment, the second channel length is a sub-minimal geometry with respect to the first channel length.

20 Claims, 3 Drawing Sheets

US 7,612,577 B2

SPEEDPATH REPAIR IN AN INTEGRATED CIRCUIT

BACKGROUND

1. Field

This disclosure relates generally to integrated circuits, and more specifically, to integrated circuits in which speedpath operations are critical.

2. Related Art

In many integrated circuits, certain operations must occur within a certain time. Setup and hold times are examples. Another typical one is the speed of performing a read in a memory. But there additionally many operations that need to occur by a certain time or within a certain time window in order to achieve an overall speed requirement. In these cases, there is often one signal path that is most critical in achieving the needed timing. This is often called the critical speedpath. The critical speedpath is the one that will generally receive the most attention in a design. Of course design mistakes can occur so that either the speedpath is not optimized or is not fully understood. With or without a mistake though, one of the critical speedpaths (an integrated circuit is likely to have more than one) will likely be the cause of the integrated circuit to not meet its specification and be considered a failed device. This will often occur due to process variations that result in the timing through the critical speedpath being too slow. In some designs, a failure may result from the timing actually being too fast. Whether the timing is too fast or too slow for the design, the result is costly.

Accordingly there is a need for providing a technique for reducing the occurrences of not achieving the desired timing in a critical speedpath.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
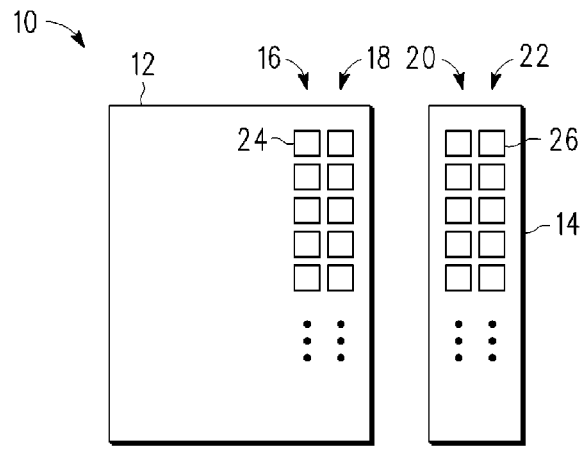
FIG. 1 is a block diagram of a memory according to a first embodiment.

A speedpath has transistors of a channel length that is chosen as the standard nominal channel length for optimizing the operation of the speedpath for typical operation. In the event the speedpath does not provide the proper timing, which may occur due to process variations, the speedpath is replaced by another circuit that has transistors of a different channel length. The different channel length may be achieved by having transistors of a shorter nominal channel length than the standard nominal channel length form a corresponding circuit to the one that is too slow when the process variations cause a long channel length. The standard nominal channel length is normally chosen in part to reduce leakage which typically is higher for shorter channel lengths. That is to say, there is a choice between higher speed and lower leakage when choosing the standard nominal channel length. For certain speedpaths, the chosen low leakage transistors may result in too slow of a speed under some process conditions. When that occurs, the replacement circuit with the shorter channel length transistors is substituted for the original circuit which has the affect of repairing the speedpath. This is better understood by reference to the following description and the drawings.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by "B" following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Shown in FIG. 1 is a circuit 10 comprising a memory 12 and a redundant memory 14. Memory 12 is comprises columns and rows of memory bitcells. Shown in FIG. 1 are exemplary columns 16 and 18. An exemplary memory bitcell 24 is shown in column 16. Similarly, redundant memory 14 also comprises columns but of significantly fewer number than that of memory 12. Exemplary columns shown in FIG. 1 of redundant memory 14 comprise columns 20 and 22. Shown in FIG. 1 is exemplary memory bitcell 26 in column 20. Redundant memory 14 is for providing substitute columns to replace defective columns of memory 12. How columns and rows of a memory are replaced with redundant rows and columns is well understood in the art.

One possible operation is for column 20 to replace column 16. One possible failure mode for column 16 is that it cannot be read quickly enough. Column 20 comprises memory bitcells, such as memory bitcell 26, which have transistors with shorter channel lengths than those of column 16. With the shorter channel lengths, the memory bitcells provide more drive current and less capacitance and thus may be read more quickly.

Figure 2:
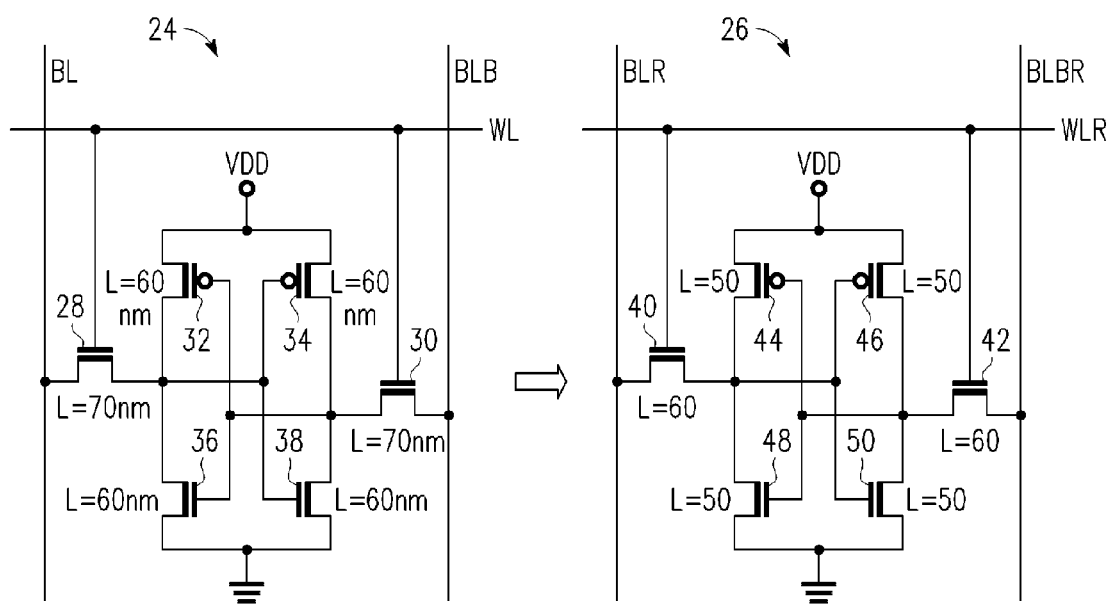
FIG. 2 is a circuit diagram of a portion of the memory of FIG. 1.

Shown in FIG. 2 are circuit diagrams of memory bitcells 24 and 26, which are shown as static random access memory (SRAM) cells. For this example of column 16 being replaced by column 20, memory bitcell 26 replaces memory bitcell 24. Memory bitcell 24 comprises a pass transistor 28, a pass transistor 30, a P channel transistor 32, a P channel transistor 34, an N channel transistor 36, and an N channel transistor 38 coupled together in standard SRAM fashion. Pass transistors in this example are N channel transistors. For integrated circuits currently in production, one exemplary technology would be for the pass transistors, transistors 28 and 30, to have a nominal channel length of 70 nanometers (nm); the P channel pull-up transistors, transistors 32 and 34, to have a 60 nm nominal channel length; and N channel pull-down transistors, transistors 36 and 38, to have a nominal channel length of 60 nm. In this example, then, the smallest transistors in the normal design would have this nominal channel length of 60 nm. This is not now generally just a limitation associated with lithographic capability. The transistors could have a nominal channel length of 50 nm but would have excessive leakage and potentially other undesirable affects on transistor performance such as reduced reliability. With process variation, the actual channel length varies from 50 to 70 nm for the nominal channel length of 60 nm. The nominal channel length can be viewed as what the channel length is designed to be. The nominal channel length is typically at the center of the differences due to process variations. Pass transistors 28 and 30, with a nominal channel length of 70 nm, vary between 60 and 80 nm. For the case where the operation is too slow, is almost certainly going to be the case where pass transistors 28 and 30 will have an above nominal channel length that is probably nearer 80 nm than 70 nm. Channel length variation is typically the same for all of the transistors so that for the case of pass transistors 28 and 30 having a channel length near 80, transistors 28, 30, 32, and 34 will have a channel length near 70 nm.

Memory bitcell 26 comprises a pass transistor 40, a pass transistor 42, a P channel transistor 44, a P channel transistor 46, an N channel transistor 48, and an N channel transistor 50 coupled together in the same way as memory bitcell 24 as a standard SRAM cell. In this example, pass transistors, transistors 40 and 42, have a nominal channel length of 60 nanometers nm; the P channel pull-up transistors, transistors 44 and 46, have a 50 nm nominal channel length; and N channel pull-down transistors, transistors 48 and 50, have a nominal channel length of 50 nm. Thus, the transistors of memory bitcell 26 have channel lengths that are about 10 nm less than those of memory bitcell 24. This keeps the relationships of the channel lengths of the various transistors about the same as for cell 26 as for cell 24. Although transistors of a given integrated circuit change channel length somewhat the same, there is still some variation in channel length among transistors designed for the same nominal channel length. Thus, the result has been that there may be only a few memory bitcells that are too slow due to an excessive channel length. The replacement of memory bitcell 24 with memory bitcell 26 is likely to occur when the channel lengths of the transistors of memory bitcell 24 are increased by nearly 10 nm so that the channel lengths of the transistors of memory bitcell are also increased by nearly 10 nm. In such case, the transistors of memory bitcell 26 are nearly the same as the nominal channel length of the transistors of memory bitcell 24. Accordingly, memory bitcell 26 operates as a replacement in a situation in which its transistors are nearly at the nominal channel lengths for the memory bitcells as designed for memory 12. The primary improvement in speed is due to pass transistors 40 and 42 having increased drive and reduced capacitance due to the reduced channel length. Transistors 44, 46, 48, and 50 have their channel lengths lower than their counterparts in memory bitcell 24 to keep their ratios to the pass transistors about the same. The ratios of the pass, pull-up, and pull-down transistors is known to be important for reliable reading and writing.

In affect, the memory bitcells themselves are each a critical speedpath. When a column is found to be too slow because one or more memory bitcells on the column is too slow, then the memory bitcell that is too slow is a critical speedpath that is too slow. Replacing the whole column with cells of shorter channel lengths has the affect replacing the slow critical speedpath with a circuit comprising transistors of a shorter channel length. Only redundant columns are shown in FIG. 1, but redundant rows may also be used that have memory bitcells with transistors with the reduced nominal channel length.

Figure 3:
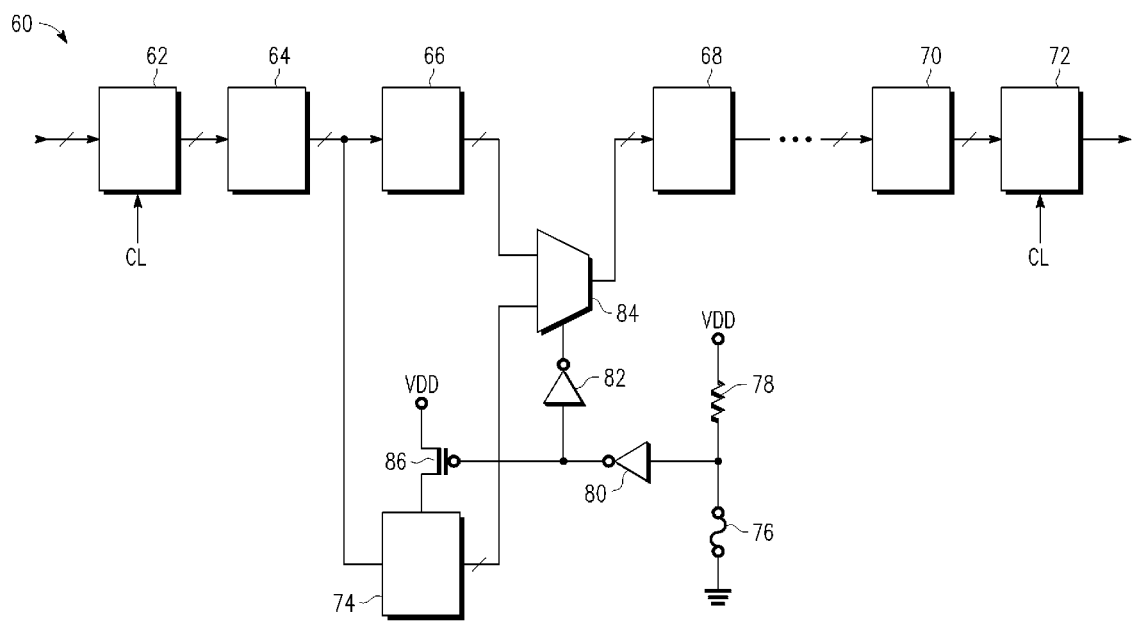
FIG. 3 is a block diagram of a speedpath according to a second embodiment.

Shown in FIG. 3 is a circuit 60 comprising a flip-flop 62, a logic circuit 64, a logic circuit 66, a logic circuit 68, a logic circuit 70, a flip-flop 72, a logic circuit 74, a fuse 76, a load 78, an inverter 80, an inverter 82, a multiplexer (mux) 84, and a P channel transistor 86. Flip-flop 62 has an input for receiving an input signal, a clock input for receiving a clock signal CL, and an output. Logic circuit 64 has an input coupled to the output of flip-flop 62 and an output. Logic circuit 66 has an input coupled to the output of logic circuit 64 and an output. Logic circuit 74 has an input coupled to the output of logic circuit 64, a power node, and an output. Mux has a first input coupled to the output of logic circuit 66, a second input coupled to the output of logic circuit 74, a control input, and an output. Logic circuit 68 has an input coupled to the output of mux 84, a select input, and an output. Logic circuit 79 has an input coupled to the output of logic circuit 68, and an output. Flip-flop 72 has an input coupled to the output of logic circuit 70, a clock input for receiving clock signal CL, and an output for providing an output signal. Fuse 76 has a first terminal coupled to ground and a second terminal. Load 78 has a first terminal coupled to a positive power supply terminal VDD for receiving a positive power supply voltage and a second terminal coupled to the second terminal of fuse 76. Inverter 80 has an input coupled to the second terminal of fuse 76 and an output. Inverter 82 has an input coupled to the output of inverter 80 and an output coupled to the control input of mux 84. Transistor 86 has a gate connected to the output of inverter 80, a source connected to VDD, and a drain connected to the power node of logic circuit 74.

In normal operation, flip-flop 62 stores a signal responsive to clock signal CL. Logic operations are performed by logic circuits 64, 66, 68, and 70, and flip-flop 72 stores the result responsive to clock signal CL and provides an output representative of what it stores. Each of logic circuits 64-70 is a speedpath. The path from flip-flop 62 to 72 is also a speedpath. In this example, logic circuit 66 is considered a critical speedpath and can be replaced by logic circuit 74. Logic circuit 66 comprises transistors of the standard nominal channel length. Logic circuit 74 comprises transistors of a shorter nominal channel length. Because the process variations generally cause the transistor length to vary at least somewhat the same, the transistors with the shorter nominal channel length will have shorter lengths than the transistors of the standard nominal channel length. The result is that for the case where logic circuit 66 is too slow due to transistors with excessive channel length, logic circuit 74, with its shorter channel length transistors and corresponding higher speed is substituted for logic circuit 66. Once it is detected that the speed from flip-flop 62 to flip-flop 72, which may occur during testing of the integrated circuit of which circuit 60 is a part, fuse 76 is blown causing a logic high applied to the input of inverter 80. Transistor 86 becomes conductive and thereby applying power to logic circuit 74. Inverter 74 thus responds to the output of logic circuit 64 and provides an output signal on its output to mux 84. Inverter 82 responds to the logic low output of inverter 82 by providing a logic high to mux 84. Mux 84 responds by coupling the output of logic circuit 74 to the input of logic circuit 68. In normal operation, fuse 76 is conductive and causes a logic high input to inverter 80. This causes transistor 86 to be non-conductive and inverter 82 to cause mux 84 to select the output of logic circuit 66 for coupling to the input of logic circuit 68.

Figure 4:
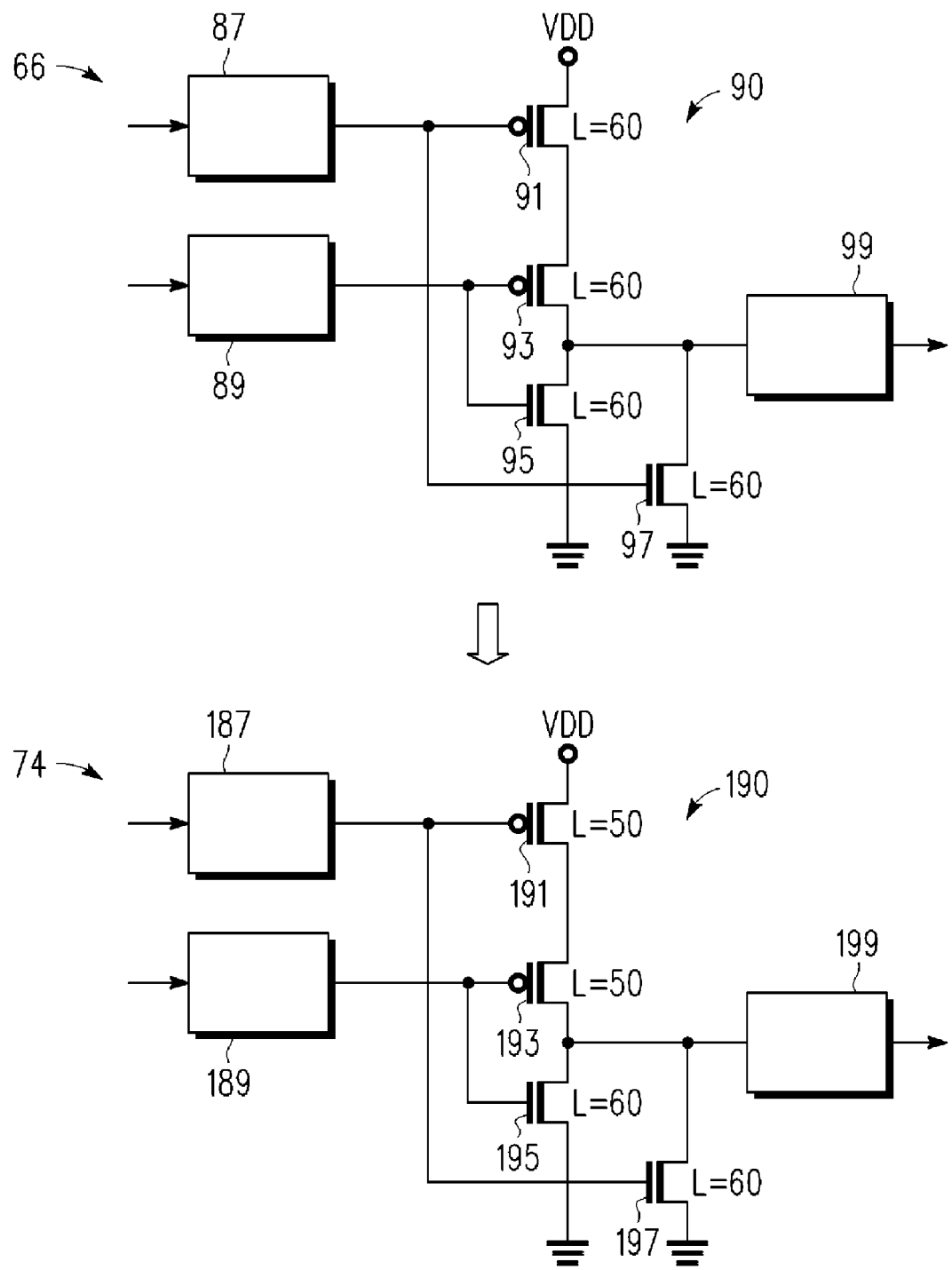
FIG. 4 is a combination block and circuit diagram of a portion of the speedpath of FIG. 3.

Shown in FIG. 4 are logic circuit 66 and logic circuit 74 in more detail. Logic circuit 66 comprises a logic circuit 87, a logic circuit 89, a NOR gate 90, and a logic circuit 99. Logic circuit 87 has an input coupled to the output of logic circuit 64 and an output. Logic circuit 89 has an input coupled to the output of logic circuit and an output. NOR gate 90, which is a representative logic gate, comprises P channel transistors 91 and 93 and N channel transistors 95 and 97 that are connected in the conventional manner of forming a CMOS NOR gate. Logic circuit 99 has an input coupled to an output of NOR gate 90 and an output coupled to the first input of mux 84. All of the transistors, transistors 91, 93, 95, and 97, of NOR gate 90 have the standard nominal gate length of 60 nm.

Logic circuit 74 comprises a logic circuit 187 that corresponds to logic circuit 87, a logic circuit 189 that corresponds to logic circuit 89, a NOR gate 190 that corresponds to logic gate 190, and a logic circuit that corresponds to logic circuit 99. NOR gate 190 comprises P channel transistors 191 and 193 that correspond to P channel transistors 91 and 93 and N channel transistors 195 and 197 that correspond to N channel transistors 95 and 95. The corresponding elements are the same and are connected together the same, except for channel length differences in some of the transistors. As shown in FIG. 4, transistors 191 and 193 have a shorter nominal channel length of 50 nm than corresponding transistors 91 and 93 which have the standard nominal channel length. This shows that only portions of a replacement logic circuit or logic gate may have different nominal channel lengths than their corresponding elements in the circuit that is being replaced. In the same way, some transistors in logic circuits 87 and 99 may have different channel lengths than those of corresponding logic circuits 187 and 199. As an additional alternative, logic circuit 189 may not be required at all and that logic circuit 89 would not be replaced. In such case the output of logic circuit 89 would be connected to both NOR gate 90 and NOR gate 190.

By now it should be appreciated that there has been provided a circuit having a first plurality of transistors, a second plurality of transistors, and a means for selectively replacing. The first plurality of transistors have a first channel length and are disposed along a speedpath. The first plurality of transistors provide a first timing performance. The second plurality of transistors have a second channel length and have an expected equivalent functionality as the first plurality of transistors. The second plurality of transistors are disposed in parallel with the first plurality of transistors along the speedpath. The second channel length is different from the first channel length. The means for selectively replacing replaces the first plurality of transistors with the second plurality of transistors in response to a determination that the first timing performance of the first plurality of transistors fails a timing requirement of the speedpath. The second channel length may be a sub-minimal geometry with respect to the first channel length. The means for selectively replacing may include a multiplexer having first and second multiplexer inputs, a multiplexer select input and an output, wherein an output of the first plurality of transistors disposed along the speedpath couples to the first multiplexer input, an output of the second plurality of transistors disposed in parallel along the speedpath couples to the second multiplexer input, and wherein responsive to a first state on the multiplexer select input, the first multiplexer input is coupled to the multiplexer output and responsive to a second state on the multiplexer select input, the second multiplexer input is coupled to the multiplexer output. The circuit may further include a fuse in which the fuse couples to the multiplexer select input, and wherein the fuse provides one of the first state or the second state on the multiplexer select input as a function of a condition of the fuse. The fuse may comprise a post-silicon programmable device. The circuit may further comprise a switch for disabling the second plurality of transistors in response to the first plurality of transistors meeting the speedpath timing requirement and in order to ensure meeting of a maximum current leakage specification. The first plurality of transistors may comprise a bitcell of a memory, and the second plurality of transistors may comprise a redundant bit cell of the memory. The second plurality of transistors may be selected from a group consisting of (i) a p-channel pull-up transistor, (ii) an n-channel pull-down transistor, and (iii) an n-channel pass transistor. The the circuit may comprise a peripheral circuit to a memory and wherein the speedpath is included within the peripheral circuit. The circuit may include a plurality of logic elements coupled between a first flip-flop and a second flip-flop, wherein the plurality of logic elements provide a given timing performance, wherein at least one logic element of the plurality of logic elements controls the timing performance of the speedpath. The at least one logic element may further include the first plurality of transistors which is selectively replaced by a second logic element that includes the second plurality of transistors. The at least one logic element may further include the first plurality of transistors and the second plurality of transistors. The at least one logic element may include a logic gate. The determination that the first timing performance of the first plurality of transistors fails a timing requirement of the speedpath may include at least one selected from the group consisting of (i) a physical measurement representative of the first channel length exceeding a threshold channel length geometry and (ii) an electrical timing measurement of the first plurality of transistors not meeting or exceeding the speedpath timing requirement.

Also described is a method of implementing a circuit. The method includes providing a first plurality of transistors of a first channel length disposed along a speedpath, the first plurality of transistors characterized by a first timing performance. The method further includes providing a second plurality of transistors of a second channel length having an expected equivalent functionality as the first plurality of transistors and disposed in parallel with the first plurality of transistors along the speedpath, wherein the second channel length is different from the first channel length. The method further includes selectively replacing the first plurality of transistors with the second plurality of transistors in response to a determination that the first timing performance of the first plurality of transistors fails a timing requirement of the speedpath. The method may further be characterized by the second channel length is a sub-minimal geometry with respect to the first channel length. The providing the first plurality of transistors may comprise providing a bitcell of a memory, and providing the second plurality of transistors may comprises providing a redundant bitcell of the memory. The the step of providing the second plurality of transistors may be further characterized by the second plurality of transistors being in a group consisting of (i) a p-channel pull-up transistor, (ii) an n-channel pull-down transistor, and (iii) an n-channel pass transistor. The determining that the first timing performance of the first plurality of transistors fails a timing requirement of the speedpath may include performing a physical measurement representative of the first channel length wherein the measurement exceeds a threshold channel length geometry. The determining that the first timing performance of the first plurality of transistors fails a timing requirement of the speedpath may include performing an electrical timing measurement of the first plurality of transistors wherein the measurement does not meet or exceed the speedpath timing requirement.

Also described is a circuit having a speedpath and including a first means, a second means, and a replacement means. The first means is for performing a function in the speedpath. The first means comprises a first plurality transistors having channel lengths. The second means is for performing the function. The second means comprises a second plurality of transistors. Each transistor of the second plurality of transistors has a corresponding transistor in the first plurality of transistors. Each transistor of the second plurality of transistors has a shorter channel length than its corresponding transistor.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. For example, the speedpaths were described as being memory or logic whereas the principles may be applied to an analog circuit in that circuit elements with faster transistors may be used to replace the ones that are producing improper timing. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit comprising:
   a first plurality of transistors of a first channel length disposed along a speedpath, the first plurality of transistors providing a first timing performance;
   a second plurality of transistors of a second channel length having an expected equivalent functionality as the first plurality of transistors and disposed in parallel with the first plurality of transistors along the speedpath, wherein the second channel length is different from the first channel length; and
   means for selectively replacing the first plurality of transistors with the second plurality of transistors in response to a determination that the first timing performance of the first plurality of transistors fails a timing requirement of the speedpath.

2. The circuit of claim 1, wherein the second channel length is a sub-minimal geometry with respect to the first channel length.

3. The circuit of claim 1, wherein the selectively replacing means includes
   a multiplexer having first and second multiplexer inputs, a multiplexer select input and an output, wherein an output of the first plurality of transistors disposed along the speedpath couples to the first multiplexer input, an output of the second plurality of transistors disposed in parallel along the speedpath couples to the second multiplexer input, and wherein responsive to a first state on the multiplexer select input, the first multiplexer input is coupled to the multiplexer output and responsive to a second state on the multiplexer select input, the second multiplexer input is coupled to the multiplexer output.

4. The circuit of claim 3, further comprising a fuse, wherein the fuse couples to the multiplexer select input, and wherein the fuse provides one of the first state or the second state on the multiplexer select input as a function of a condition of the fuse.

5. The circuit of claim 4, wherein the fuse comprises a post-silicon programmable device.

6. The circuit of claim 1, further comprising:
   a switch for disabling the second plurality of transistors in response to the first plurality of transistors meeting the speedpath timing requirement and in order to ensure meeting of a maximum current leakage specification.

7. The circuit of claim 1, wherein the first plurality of transistors comprise a bitcell of a memory, and wherein the second plurality of transistors comprise a redundant bit cell of the memory.

8. The circuit of claim 7, further wherein the second plurality of transistors is selected from a group consisting of (i) a p-channel pull-up transistor, (ii) an n-channel pull-down transistor, and (iii) an n-channel pass transistor.

9. The circuit of claim 1, wherein the circuit comprises a peripheral circuit to a memory and wherein the speedpath is included within the peripheral circuit.

10. The circuit of claim 1, wherein the circuit includes a plurality of logic elements coupled between a first flip-flop and a second flip-flop, wherein the plurality of logic elements provide a given timing performance, wherein at least one logic element of the plurality of logic elements controls the timing performance of the speedpath.

11. The circuit of claim 10, wherein the at least one logic element further includes the first plurality of transistors which is selectively replaced by a second logic element that includes the second plurality of transistors.

12. The circuit of claim 10, wherein the at least one logic element further includes the first plurality of transistors and the second plurality of transistors.

13. The circuit of claim 10, wherein the at least one logic element includes a logic gate.

14. The circuit of claim 1, wherein the determination that the first timing performance of the first plurality of transistors fails a timing requirement of the speedpath includes at least one selected from the group consisting of (i) a physical measurement representative of the first channel length exceeding a threshold channel length geometry and (ii) an electrical timing measurement of the first plurality of transistors not meeting or exceeding the speedpath timing requirement.

15. A method of implementing a circuit comprising:
providing a first plurality of transistors of a first channel length disposed along a speedpath, the first plurality of transistors characterized by a first timing performance;
providing a second plurality of transistors of a second channel length having an expected equivalent functionality as the first plurality of transistors and disposed in parallel with the first plurality of transistors along the speedpath, wherein the second channel length is different from the first channel length; and
selectively replacing the first plurality of transistors with the second plurality of transistors in response to a determination that the first timing performance of the first plurality of transistors fails a timing requirement of the speedpath.

16. The method of claim 15, wherein the second channel length is a sub-minimal geometry with respect to the first channel length.

17. The method of claim 15, wherein providing the first plurality of transistors comprise a bitcell of a memory, and wherein providing the second plurality of transistors comprises providing a redundant bitcell of the memory.

18. The method of claim 17, further wherein the step of providing the second plurality of transistors is further characterized by the second plurality of transistors being in a group consisting of (i) a p-channel pull-up transistor, (ii) an n-channel pull-down transistor, and (iii) an n-channel pass transistor.

19. The method of claim 15, wherein determining that the first timing performance of the first plurality of transistors fails a timing requirement of the speedpath includes performing an electrical timing measurement of the first plurality of transistors and wherein the measurement does not meet or exceed the speedpath timing requirement.

20. A circuit having a speedpath, comprising;
first means for performing a function in the speedpath, wherein the first means comprises a first plurality transistors having channel lengths;
second means for performing the function, wherein the second means comprises a second plurality of transistors, wherein each transistor of the second plurality of transistors has a corresponding transistor in the first plurality of transistors, and each transistor of the second plurality of transistors has a shorter channel length than its corresponding transistor; and
replacement means for replacing the first means with the second means if the speedpath does not meet a speed requirement.

* * * * *